United States Patent [19]

Dohya

[11] Patent Number: 5,012,047
[45] Date of Patent: Apr. 30, 1991

[54] MULTILAYER WIRING SUBSTRATE

[75] Inventor: Akihiro Dohya, Tokyo, Japan

[73] Assignee: NEC Corporation, Minato, Japan

[21] Appl. No.: 481,726

[22] Filed: Feb. 16, 1990

Related U.S. Application Data

[63] Continuation of Ser. No. 178,013, Apr. 5, 1988, abandoned.

[30] Foreign Application Priority Data

Apr. 6, 1987 [JP] Japan ................... 62-82845

[51] Int. Cl.$^5$ ............................ H01B 7/34; H05K 7/20
[52] U.S. Cl. ................................ 174/250; 174/32; 333/1; 333/238; 361/414
[58] Field of Search ............... 174/32, 36, 110 F, 250, 174/251, 255; 361/414, 424, 305; 333/1, 238, 246

[56] References Cited

U.S. PATENT DOCUMENTS

| 2,721,312 | 10/1955 | Grieg ........................... 333/238 |
| 2,919,441 | 11/1959 | Chu ............................. 174/68.5 |
| 2,952,579 | 9/1960 | Merriman ................... 174/68.5 |
| 3,575,674 | 4/1971 | Howe, Jr. .................... 333/116 |
| 3,581,243 | 5/1971 | Alford ......................... 333/116 |
| 3,700,825 | 10/1972 | Taplin et al. ............... 174/36 |
| 3,777,221 | 12/1973 | Tatsuko et al. ............ 361/414 X |
| 3,834,960 | 9/1974 | Prentcie et al. ........... 174/110 F X |
| 4,234,367 | 11/1980 | Herron et al. .............. 156/89 |
| 4,245,273 | 1/1981 | Feinberg et al. ........... 361/382 |
| 4,322,778 | 3/1982 | Barbour ...................... 361/414 |
| 4,640,866 | 2/1987 | Suzuki, II .................. 174/68.5 X |
| 4,649,228 | 3/1987 | Suzuki ........................ 174/36 |
| 4,721,831 | 1/1988 | Vaora .......................... 174/68.5 |
| 4,734,315 | 3/1988 | Bate ............................. 361/414 |
| 4,766,671 | 8/1988 | Utsumi et al. ............. 174/68.5 X |
| 4,774,630 | 9/1988 | Reisman et al. ........... 174/16.3 X |

FOREIGN PATENT DOCUMENTS 1578326 7/1969 France ..................... 174/110 F

OTHER PUBLICATIONS

Hexcel Products Inc., Reinforced Plastic Honeycomb in Electronic Circuit Sandwich, Technical Service Bull., California, 1959.

*Primary Examiner*—Gerald P. Tolin
*Attorney, Agent, or Firm*—Burns, Doane, Swecker & Mathis

[57] ABSTRACT

A multilayer wiring substrate which includes a plurality of laminated wiring layers, a plurality of insulating layers for providing insulation between the wiring layers, and a plurality of hollows provided within at least one of the insulating layers.

14 Claims, 2 Drawing Sheets

MULTILAYER WIRING SUBSTRATE

This application is a continuation of application Ser. No. 07/178,013, filed April 5, 1988, now abandoned.

BACKGROUND OF THE INVENTION

The invention relates to a multilayer wiring substrate.

An example of a conventional multilayer wiring substrate is described in U.S. Pat. No. 4,245,273. In the substrate proposed in the U.S. Patent, a set of signal planes 58, 60 and 64 with ceramic insulating layers inserted therebetween are sandwiched between ground planes 54 and 56. The ground planes 54 and 56 are provided so as to eliminate the cross-talk between signal lines in the signal planes 58, 60 and 64, and to make uniform the characteristic impedances of the lines. The characteristic impedance $Z_0$ of a signal line is given by $Z_0 = (L_0/C_0)^{\frac{1}{2}}$, where $L_0$ and $C_0$ denote the inductance and capacitance of the signal line, respectively. The signal-propagation delay time $T_0$ of the line is given by $T_0 = (L_0/C_0)^{\frac{1}{2}}$. The capacitance of the signal line $C_0$ is proportional to the dielectric constant $\epsilon$ of insulating layers in contact with the line, while the signal-propagation delay time $T_0$ is proportional to $(\epsilon)^{\frac{1}{2}}$. Since the delay time $T_0$ is the time required for an electric pulse to transmit along a signal path, it is preferable for it to be as short as possible. Thus, the magnitude of the dielectric constant $\epsilon$ is favored to be small. On the other hand, a desirable value of the characteristic impedance $Z_0$ is in the range from 40 to 80 ohms. It depends strongly upon the signal line width, and upon the dielectric constant of the insulating layers. Since the line width is limited by a required direct-current resistance of the signal line and by the density of signal lines per unit area, it is difficult to choose the line width freely. Moreover, since the dielectric constant is determined by the insulating material used, the value of the characteristic impedance $Z_0$ is difficult to choose freely.

An object of the invention is, therefore, to provide a multilayer wiring substrate free from the above-mentioned disadvantages.

SUMMARY OF THE INVENTION

As one aspect of the invention, there is provided a multilayer wiring substrate which comprises: a plurality of laminated wiring layers; a plurality of insulating layers for providing insulation between the wiring layers; and a plurality of hollows provided within at least one of the insulating layers.

BRIEF DESCRIPTION OF THE DRAWINGS

Other features and advantages of the invention will become more apparent from the following detailed description when taken in conjunction with the accompanying drawings in which.

Figure 1:
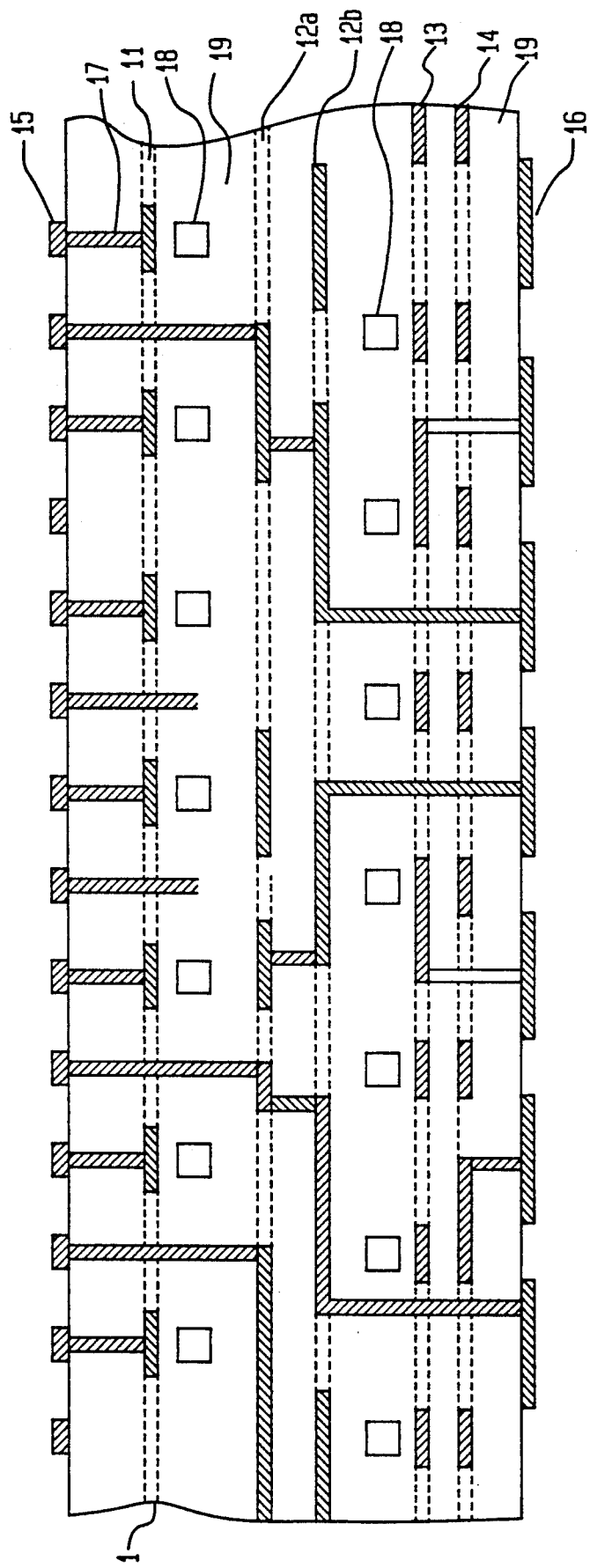
FIG. 1 is a cross-sectional view of an embodiment of the invention.

In these drawings, the same reference numerals represent the same structural elements, respectively. cl DETAILED DESCRIPTION OF THE INVENTION Referring to FIG. 1, an embodiment of the invention is illustrated and comprises ground layers 11 and 13 formed in a substrate 1, first and second signal wiring layers 12a and 12b, insulating layers 19 for insulating the ground and signal layers from each other, and hollows 18 provided within the insulating layers 19. A surface signal wiring layer 15 is provided on the upper surface of the substrate 1, while a surface signal wiring layer 16 on its lower surface. The layers 15 and 16 are connected to other signal wiring layers through via-holes 17. The layers 15 and 16 work as bonding pads for connecting leads of large scale 20 integrated (LSI) circuits (not shown) and as lands for I/O pins, respectively. The substrate 1 comprises a power supply layer 14 in addition to the layers 11, 13, 12a and 12b. The layers 11, 13 and 14 are made in the form of mesh, through which the via-holes 17 penetrate. The running direction of the signal lines constituting the signal wiring layer 12a is chosen to be perpendicular to that of the signal lines of the signal wiring layer 12b. The insulating layers 19 are made of glass ceramic, whose main portion is alumina. The hollows 18 are disposed at distances corresponding to the mesh pattern of the ground layers 11 and 13. The thickness of the insulating layer between the layer 11 and 12a and the thickness of the insulating layer between the layers 13 and 12b is about 300 micrometers ($\mu$m), while the shape of the hollows 18 is a cube whose one side is about 150 $\mu$m long. The volume ratio of the whole hollows 18 to the entire insulating layer between the layers 11 and 13 is approximately 20%. In this case, the apparent relative dielectric constant of the insulating layer containing the hollows is given by $$\epsilon = \frac{5\epsilon_1 \epsilon_2}{\epsilon_1 + 4\epsilon_2},$$

where $\epsilon_1$ and $\epsilon_2$ denote the relative dielectric constants of the insulating layer and the hollows, respectively. Since $\epsilon_1$ and $\epsilon_2$ are approximately 9 and 1, $$\epsilon = \frac{5 \times 9 \times 1}{9 + 4} = \frac{45}{13} = 3.5$$

The substrate 1 is fabricated by way of the so-called green sheet method, as is disclosed in U.S. Pat. No. 4,234,367. First, alumina powder and glass powder of lead borosilicate system are mixed with a weight ratio of 1:1. The two kinds of powder has average particle sizes in the range of 1 to 10 $\mu$m. An organic binder such as polyvinylbutyral (PVB) and a solvent such as butyl-carbitol are mixed with the mixed powder and then stirred up to make a slurry. Next, the slurry is cast on a polyester film with a constant thickness by way of a doctor-blading technique. Therefore, the slurry is made dry, with the result that a green sheet whose thickness is 100 $\mu$m is produced on the polyester film. Then, the green sheet is taken off from the polyester film and cut into pieces of suitable size, in which necessary through-holes are bored by means of a through-hole fabricator.

Figure 2A:
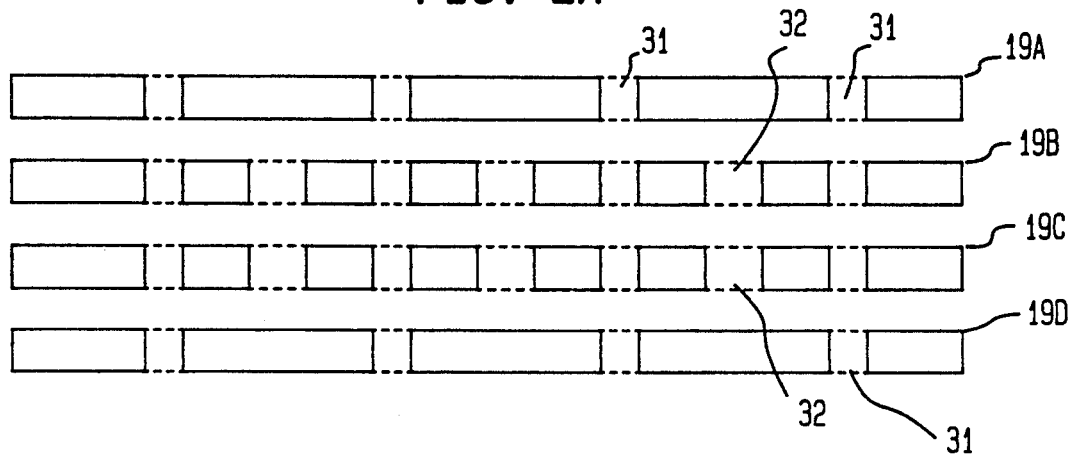
FIGS. 2A to 2C are cross-sectional views for illustrating the method of manufacturing a substrate shown in FIG. 1.
Figure 2B:
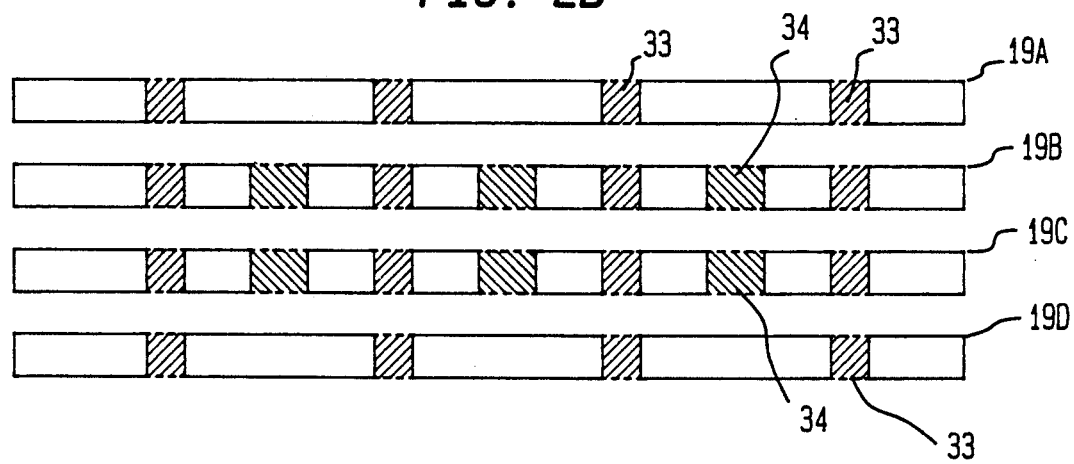

As is shown in FIG. 2A, through-holes 31 of circular section are bored through four green sheets 19A, 19B, 19C and 19D. Through-holes 32 of rectangular section are also bored through the sheets 19B and 19C. The holes 31 are 130 $\mu$m in diameter, while one side of each of the holes 32 is 175 $\mu$m long. The sheets are 100 um thick. Next, as is shown in FIG. 2B, electrically conductive paste 33 is extruded into the through-holes 31 by way of screen printing. The conductive paste is composed of gold, silver, or silver-palladium alloy. Organic paste 34 is extruded into the through-holes 32 by way of screen printing. The organic paste 34 is made of polyvinylalcohol or ethylcellulose, which is burned out in air without residue.

Figure 2C:
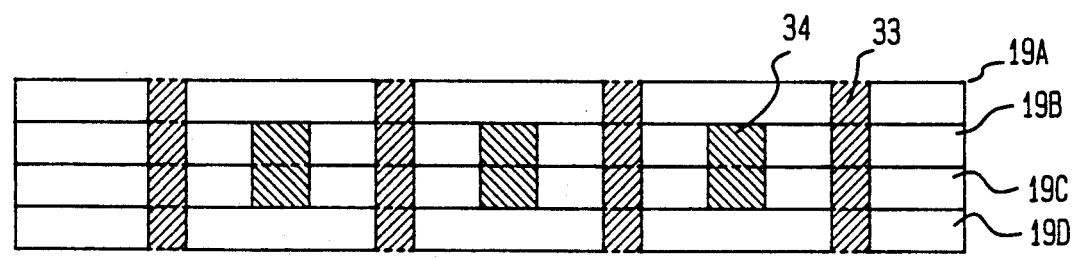

Now, as is shown in FIG. 2C, the sheets 19A, 19B, 19C and 19D are laminated together with other sheets (not shown for illustration convenience) by means of a laminating machine, after the positioning of the sheets. A suitable temperature and pressure are applied to the laminated sheets by means of a pressing machine to bond the green sheets mutually to yield a monolithic laminated substrate. Next, the laminated substrate is subjected to the firing to accomplish binder removal and coalescence of the glass particles. On this occasion the organic paste 34 is also fired to form the hollows 18. The burning of the organic paste occurs under 500° C. When the temperature rises to 900° C, the glass particles in the laminated sheets reacts with the alumina particles therein to mutually fuse and is converted into a glass-ceramic by crystallization. Simultaneously, after the organic paste is burned out, the conductive paste 33 is subjected to the concurrent sintering of the metal particles to yield the dense metal layer.

Although in the above-mentioned embodiment of the invention the insulating layers 19 is made of glass-ceramic, it may be organic resin. If, for example, polyimide having a dielectric constant of 3.5 is used with the same physical dimension as in FIG. 1, the apparent dielectric constant is given by, $$\epsilon = \frac{5 \times 3.5}{3.5 + 4} = 2.3,$$

which is significantly improved as compared with the glass-ceramic case.

As is explained above, according to the invention, hollows are disposed between a ground layer and a signal wiring layer to decrease the apparent dielectric constant of an insulating layer therebetween, with the result that the signal propagation delay time $T_0$ is made short and that the characteristic impedance $Z_0$ can easily be adjusted.

While the present invention has been described in conjunction with the preferred embodiment thereof the invention is not limited thereto, as it will be readily possible for those skilled in the art to put the present invention into practice in various other manners within the scope of the claims.

What is claimed is:

1. A multilayer wiring substrate comprising:
   a ground layer of mesh pattern;
   a signal wiring layer;
   an insulating layer providing insulation between said ground layer and said signal wiring layer; and
   a plurality of hollows provided inside said insulating layer and disposed along said mesh pattern.

2. A multilayer wiring substrate as claimed in claim 1, wherein said hollows are adjacent to said ground layer.

3. A multilayer wiring substrate as claimed in claim 1, wherein said insulating layer containing said hollows is made of a ceramic material.

4. A multilayer wiring substrate as claimed in claim 1, wherein said insulating layer containing said hollows is made of polyimide.

5. A multilayer wiring substrate as claimed in claim 1, wherein said hollows are cube-shaped.

6. A multilayer wiring substrate as claimed in claim 5, wherein said cube-shaped hollows have a side dimension of about 150 μm in length.

7. A multilayer wiring substrate as claimed in claim 1, wherein the volume ratio of said hollows to said insulating layer is about twenty percent.

8. A multilayer wiring substrate as claimed in claim 1, wherein said multilayer wiring substrate includes a plurality of insulating layers, a plurality of signal wiring layers and a plurality of ground layers.

9. A multilayer wiring substrate as claimed in claim 8, wherein said hollows are disposed in at least one of said plurality of insulating layers between a ground layer and a signal wiring layer.

10. A multilayer wiring substrate as claimed in claim 1, wherein the thickness of the insulating layer between a signal wiring layer and a ground layer is about 300 micrometers.

11. A multilayer wiring substrate as claimed in claim 9, wherein said hollows are disposed at distances corresponding to the mesh pattern of a corresponding ground layer.

12. A multilayer wiring substrate as claimed in claim 3, wherein the apparent relative dielectric constant of said insulating layer containing said hollows is about 3.5.

13. A multilayer wiring substrate as claimed in claim 4, wherein the apparent relative dielectric constant of said insulating layer containing said hollows is about 2.3.

14. A multilayer wiring substrate comprising:
   a plurality of laminated wiring layers;
   a plurality of insulating layers providing insulation between said wiring layers; and
   a plurality of hollows provided within at least one of said insulating layers, wherein said hollows are cube-shaped and said cube-shaped hollows have a side dimension of about 150 μm in length.

* * * * *